United States Patent
Matsuo

(10) Patent No.: US 9,040,950 B2
(45) Date of Patent: May 26, 2015

(54) NONVOLATILE MEMORY DEVICE AND METHOD FOR MANUFACTURING SAME

(75) Inventor: Kouji Matsuo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 378 days.

(21) Appl. No.: 13/225,926

(22) Filed: Sep. 6, 2011

(65) Prior Publication Data

US 2012/0068145 A1    Mar. 22, 2012

(30) Foreign Application Priority Data

Sep. 16, 2010   (JP) .................................. 2010-207553

(51) Int. Cl.
*H01L 45/00*   (2006.01)
*H01L 27/24*   (2006.01)

(52) U.S. Cl.
CPC ............ *H01L 45/1608* (2013.01); *H01L 45/08* (2013.01); *H01L 45/1233* (2013.01); *H01L 45/1246* (2013.01); *H01L 45/146* (2013.01); *H01L 27/2409* (2013.01); *H01L 27/2481* (2013.01)

(58) Field of Classification Search
CPC ....... H01L 45/04; H01L 45/06; H01L 45/144; H01L 45/1233

USPC .............................. 257/4, E45.003, E21.004
See application file for complete search history.

(56) References Cited

U.S. PATENT DOCUMENTS

| | | | | |
|---|---|---|---|---|
| 2007/0264488 | A1* | 11/2007 | Lee ................................ | 428/323 |
| 2008/0286447 | A1* | 11/2008 | Alden et al. .................. | 427/108 |
| 2009/0251940 | A1 | 10/2009 | Ito | |
| 2010/0270528 | A1* | 10/2010 | Yoo et al. .......................... | 257/3 |
| 2010/0314602 | A1 | 12/2010 | Takano et al. | |

FOREIGN PATENT DOCUMENTS

JP        2009-252974 A        10/2009

OTHER PUBLICATIONS

U.S. Appl. No. 13/176,188, filed Jul. 5, 2011, Junichi Wada.
U.S. Appl. No. 13/424,880, filed Mar. 20, 2012, Matsuo, et al.

* cited by examiner

*Primary Examiner* — Monica D Harrison
(74) *Attorney, Agent, or Firm* — Oblon, McClelland, Maier & Neustadt, L.L.P.

(57) ABSTRACT

According to one embodiment, a nonvolatile memory device includes a first interconnect, an insulating layer, a needle-like metal oxide, and a second interconnect. The insulating layer is provided on the first interconnect. The needle-like metal oxide pierces the insulating layer in a vertical direction. The second interconnect is provided on the insulating layer.

24 Claims, 11 Drawing Sheets

US 9,040,950 B2

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-207553, filed on Sep. 16, 2010; the entire contents of which are incorporated herein by reference.

FIELD

Embodiments described herein relate generally to a nonvolatile memory device and a method for manufacturing the same.

BACKGROUND

In recent years, a phenomenon was discovered in which certain metal oxide materials have two states of a low resistance state and a high resistance state when a voltage is applied to the material due to the resistivity prior to the voltage application and the size of the applied voltage; and new nonvolatile memory devices utilizing such a phenomenon are drawing attention. Such a nonvolatile memory device is called ReRAM (Resistance Random Access Memory). When manufacturing ReRAM, it is necessary to form a current path called a filament inside a resistance change layer made of a metal oxide material by applying a high voltage to the resistance change layer. This is called the forming operation.

However, the manufacturing cost of conventional ReRAM undesirably increases because a considerable amount of time is necessary for the forming operation. As the memory cell becomes ultra-fine, it becomes difficult to control the forming operation to reliably form the filament; and the operational reliability of the ReRAM undesirably decreases.

DETAILED DESCRIPTION

In general, according to one embodiment, a nonvolatile memory device includes a first interconnect, an insulating layer, a needle-like metal oxide, and a second interconnect. The insulating layer is provided on the first interconnect. The needle-like metal oxide pierces the insulating layer in a vertical direction. The second interconnect is provided on the insulating layer.

Various embodiments will be described hereinafter with reference to the accompanying drawings.

A first embodiment will now be described.

Figure 1:
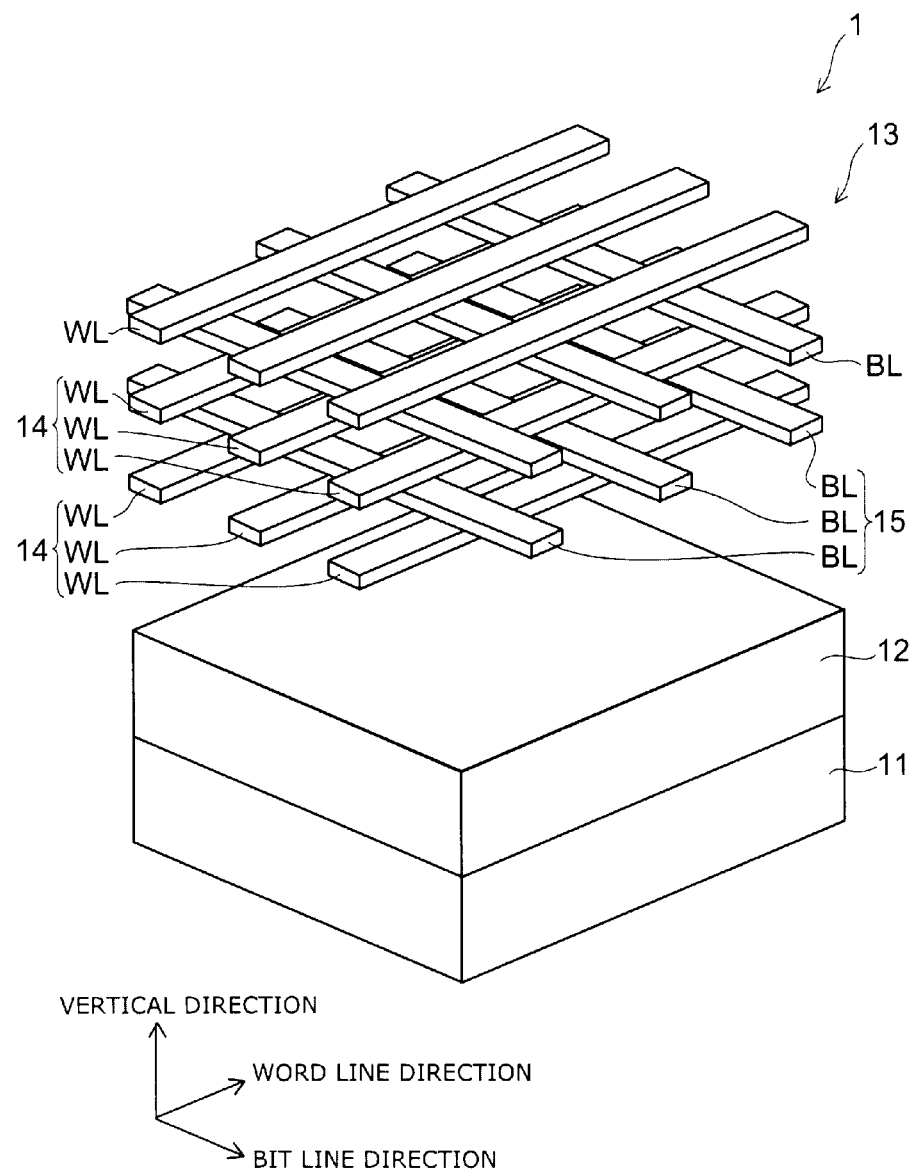
FIG. 1 is a perspective view illustrating a nonvolatile memory device according to a first embodiment.

FIG. 1 is a perspective view illustrating a nonvolatile memory device according to the embodiment.

Figure 2A:
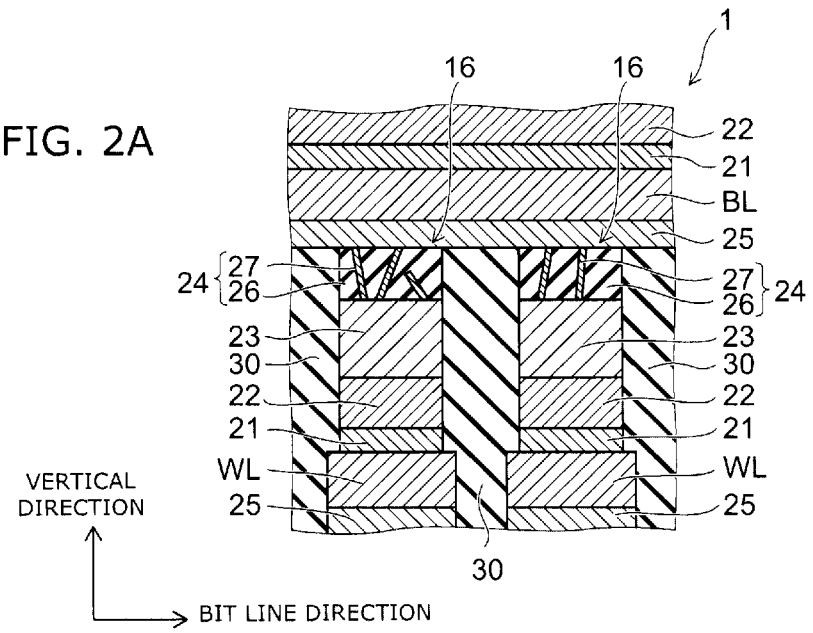
FIGS. 2A and 2B are cross-sectional views illustrating memory cells of the first embodiment.
Figure 2B:
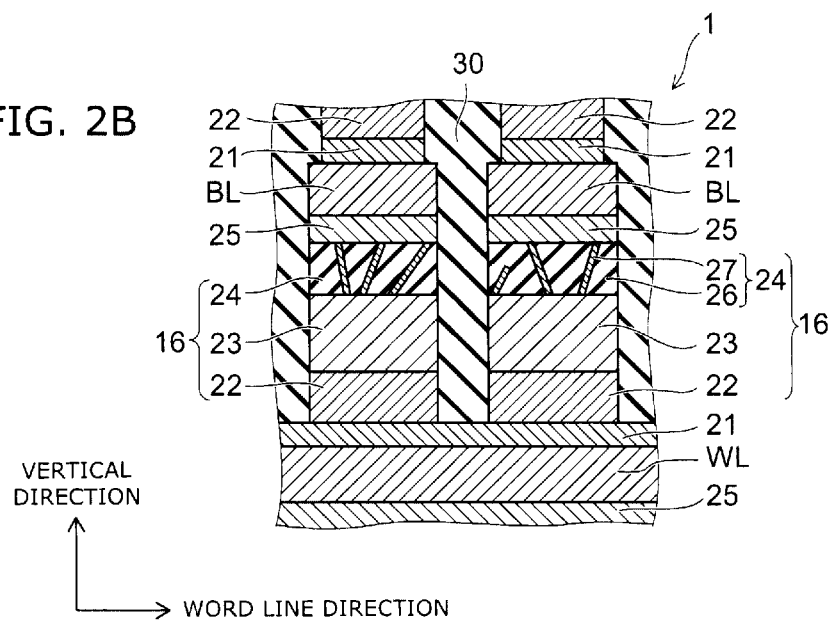

FIGS. 2A and 2B are cross-sectional views illustrating memory cells of the embodiment and are mutually orthogonal cross sections.

The nonvolatile memory device according to the embodiment is ReRAM.

In the nonvolatile memory device 1 according to the embodiment as illustrated in FIG. 1, a silicon substrate 11 is provided; and a drive circuit (not illustrated) of the nonvolatile memory device 1 is formed in the upper layer portion and on the upper surface of the silicon substrate 11. An inter-layer insulating film 12 made of, for example, silicon oxide is provided on the silicon substrate 11 to bury the drive circuit; and a memory cell unit 13 is provided on the inter-layer insulating film 12.

In the memory cell unit 13, a word line interconnect layer 14 including multiple word lines WL extending in one direction (hereinbelow referred to as the "word line direction") parallel to the upper surface of the silicon substrate 11 is stacked alternately with a bit line interconnect layer 15 including multiple bit lines BL extending in a direction (hereinbelow referred to as the "bit line direction") parallel to the upper surface of the silicon substrate 11 and intersecting e.g., being orthogonal to, the word line direction with an interposed inter-layer insulating film 30 (referring to FIGS. 2A and 2B) made of, for example, silicon oxide. The word lines WL do not contact each other; the bit lines BL do not contact each other; and the word lines WL do not contact the bit lines BL. The word line WL and the bit line BL are formed of, for example, tungsten (W). For convenience of illustration in FIG. 1, members other than the silicon substrate 11, the inter-layer insulating film 12, the word line WL, and the bit line BL are not illustrated.

As illustrated in FIGS. 2A and 2B, a barrier metal layer 21 is formed in the region directly above each of the word lines WL and each of the bit lines BL. The barrier metal layer 21 has a line configuration extending in the same direction as the word line WL or the bit line BL disposed directly thereunder. The barrier metal layer 21 is made of, for example, a two-layer film in which a titanium nitride (TiN) layer is stacked on a titanium (Ti) layer; and the barrier metal layer 21 contacts the word line WL.

A selection element layer 22, a lower electrode layer 23, and a resistance change layer 24 are stacked in this order on the barrier metal layer 21. Hereinbelow, the stacking direction is referred to as the "vertical direction." The selection element layer 22 is a layer configured to select whether or not to allow a current to flow and is a silicon diode made of, for example, polysilicon. The lower electrode layer 23 is formed of, for example, tungsten (W). The selection element layer 22, the lower electrode layer 23, and the resistance change layer 24 are divided along both the word line direction and the bit line direction and are included in a pillar 16 extending in the vertical direction.

On the other hand, an upper electrode layer 25 is formed in the region directly under each of the word lines WL and each of the bit lines BL. The upper electrode layer 25 has a line configuration extending in the same direction as the word line WL or the bit line BL disposed directly thereabove. The upper electrode layer 25 includes, for example, a titanium nitride layer (TiN) stacked with a tungsten layer (W).

One memory cell including the barrier metal layer 21, the selection element layer 22, the lower electrode layer 23, the resistance change layer 24, and the upper electrode layer 25 is formed at each of the most proximal points between the word lines WL and the bit lines BL. In other words, the nonvolatile memory device 1 is a cross-point device in which a memory cell is disposed at each of the most proximal points between the word lines WL and the bit lines BL.

In the resistance change layer 24, an insulating layer 26 is provided as the main material; and multiple needles of needle-like metal oxide 27 are buried inside the insulating layer 26. The insulating layer 26 is formed of an insulating material, e.g., an oxide, e.g., silicon oxide. The needle-like metal oxide 27 is formed of a metal oxide e.g., tungsten oxide. The electrical properties of the tungsten oxide are those of a semiconductor. The needle-like metal oxide 27 is, for example, a whisker grown from the upper surface of the lower electrode layer 23.

Although each of the needles of the needle-like metal oxide 27 has a needle-like configuration extending in one direction, the directions in which the multiple needles of needle-like metal oxide 27 buried inside the insulating layer 26 extend may be the same or mutually different. In each of the pillars 16 in the resistance change layer 24, not less than one needle of the needle-like metal oxide 27 pierces the insulating layer 26 in the thickness direction, i.e., the vertical direction, of insulating layer 26; the lower end thereof is bonded to the lower electrode layer 23; and the upper end thereof contacts the upper electrode layer 25. There may exist a needle-like metal oxide 27 inside the resistance change layer 24 that does not pierce the insulating layer 26 in the vertical direction.

Operations of the nonvolatile memory device according to the embodiment will now be described.

Although the operations are described below for a memory cell in which the word line WL is provided below the memory cell and the bit line BL is provided above the memory cell as illustrated in FIGS. 2A and 2B, the operations of a memory cell in which the bit line BL is provided below the memory cell and the word line WL is provided above the memory cell also are similar.

The needle-like metal oxide 27 is formed of tungsten oxide ($WO_x$). As described above, the needle-like metal oxide 27 is a semiconductor and allows a certain amount of current to flow. On the other hand, the insulating layer 26 is insulative and substantially does not allow a current to flow. Therefore, the needle-like metal oxide 27 becomes a current path when the current flows in the resistance change layer 24. The resistance value of the resistance change layer 24 can be switched by applying a voltage to the resistance change layer 24. Although the reasons thereof are not necessarily clear, the mechanism is considered to be as follows.

When the potential applied to the bit line BL is higher than that applied to the word line WL, the oxygen ions ($O^{2-}$) inside the needle-like metal oxide 27 move toward the bit line BL. However, because the needle-like metal oxide 27 only contacts the upper electrode layer 25, the oxygen ions substantially do not move from the needle-like metal oxide 27 into the upper electrode layer 25. Therefore, in the end portion of the needle-like metal oxide 27 on the bit line BL side, i.e., the upper end portion, the oxygen concentration increases and the oxidization is in a more progressed state. Thereby, the electrical resistance of the upper end portion of the needle-like metal oxide 27 increases; and the resistance change layer 24 as an entirety is in a high resistance state.

On the other hand, when the potential applied to the bit line BL is lower than that applied to the word line WL, the oxygen ions inside the needle-like metal oxide 27 move toward the word line WL; and the oxygen concentration of the upper end portion of the needle-like metal oxide 27 decreases. At this time, because the needle-like metal oxide 27 is, for example, a whisker grown from the upper surface of the lower electrode layer 23 and the lower end portion of the needle-like metal oxide 27 is integrally bonded to the lower electrode layer 23, the oxygen ions move from the needle-like metal oxide 27 into the lower electrode layer 23; and the oxygen does not concentrate in the lower end portion of the needle-like metal oxide 27. Thereby, the electrical resistance of the upper end portion of the needle-like metal oxide 27 decreases; and the resistance change layer 24 as an entirety is in a low resistance state. Thus, the resistance change layer 24 can have the two states of the "high resistance state" and the "low resistance state." Thereby, binary data can be stored.

Effects of the embodiment will now be described.

In the embodiment, the needle-like metal oxide 27 is initially built into the resistance change layer 24; and the needle-like metal oxide 27 is a filament. Therefore, it is unnecessary to perform a forming operation to form the filament in each of the memory cells when manufacturing the nonvolatile memory device 1. As a result, the time necessary for the forming operation is eliminated; and the manufacturing cost of the nonvolatile memory device 1 can be reduced.

Also, because the needle-like metal oxide 27 is built into each of the resistance change layers 24 in the embodiment, the filament can be provided in each of the memory cells more reliably than in the case where the forming operation is performed by applying a high voltage to the metal oxide layer. Therefore, the nonvolatile memory device 1 according to the embodiment has a highly reliable operation.

In the embodiment, the absolute value of the free energy of the tungsten oxide of the needle-like metal oxide 27 is less than the absolute value of the free energy of the silicon oxide of the insulating layer 26. In other words, when comparing per mole (mol) of oxygen atoms, the absolute value $|\Delta G_{W \to WO_x}|$ of the change of the Gibbs free energy when the tungsten included in the needle-like metal oxide 27 oxidizes to change into the tungsten oxide of the needle-like metal oxide 27 is less than the absolute value $|\Delta G_{Si \to SiO_2}|$ of the change of the Gibbs free energy when the silicon included in the insulating layer 26 oxidizes to change into the silicon oxide of the insulating layer 26.

This will now be described using specific numbers.

In the case where the temperature is 300 K (Kelvin), the absolute value of the change of the Gibbs free energy for the reaction recited below is 534 kJ per mole of tungsten.

$$W + O_2 \to WO_2$$

Accordingly, the absolute value $|\Delta G_{W \to WO_2}|$ of the change of the Gibbs free energy per mole of oxygen atoms is $|\Delta G_{W \to WO_2}|=534$ kJ÷2 (the number of oxygen atoms per mole)=267 kJ/mol.

On the other hand, in the case where the temperature is 300 K, the absolute value of the change of the Gibbs free energy for the reaction recited below is 856 kJ per mole of silicon.

$$Si+O_2 \to SiO_2$$

Accordingly, the absolute value $|\Delta G_{Si \to SiO_2}|$ of the change of the Gibbs free energy per mole of oxygen atoms becomes $|\Delta G_{Si \to SiO_2}|=856$ kJ÷2 (the number of oxygen atoms per mole)=428 kJ/mol.

Therefore, $|\Delta G_{W \to WO_2}| < |\Delta G_{Si \to SiO_2}|$.

Therefore, silicon oxide is more stable than tungsten oxide; and the amount of the tungsten that is oxidized by the oxygen included in the silicon oxide is low. As a result, the oxygen concentration of the upper end portion is low; and the needle-like metal oxide 27 in the low resistance state does not undesirably transition to the high resistance state by being oxidized by the insulating layer 26 therearound. In other words, retention degradation, in which the current path once formed is undesirably lost over time, does not occur easily. Accordingly, the data once stored in the memory cell is not lost easily; and the operational reliability is high.

On the other hand, in the embodiment, the insulating layer 26 is formed of a material having a large absolute value of the Gibbs free energy ($\Delta G_{Si \to SiO_2}$). Materials having large absolute values of Gibbs free energy have high resistivities and tend to have large bandgaps. Therefore, the resistance value increases when the resistance change layer 24 is in the high resistance state; and the current consumption amount is low.

Although an example is illustrated in the embodiment in which the needle-like metal oxide 27 is formed of tungsten oxide and the insulating layer 26 is formed of silicon oxide, this is not limited thereto. It is sufficient for the needle-like metal oxide 27 to be formed of a material in which the resistance value changes when a voltage is applied; and it is sufficient for the insulating layer 26 to be formed of an insulating material. However, to obtain the effect of suppressing the retention degradation described above, it is favorable for the absolute value of the Gibbs free energy when the metal included in the needle-like metal oxide 27 changes into the metal oxide of the needle-like metal oxide 27 to be less than the absolute value of the Gibbs free energy when the metal or the semimetal included in the insulating layer 26 changes into the insulating material of the insulating layer 26.

Figure 3:
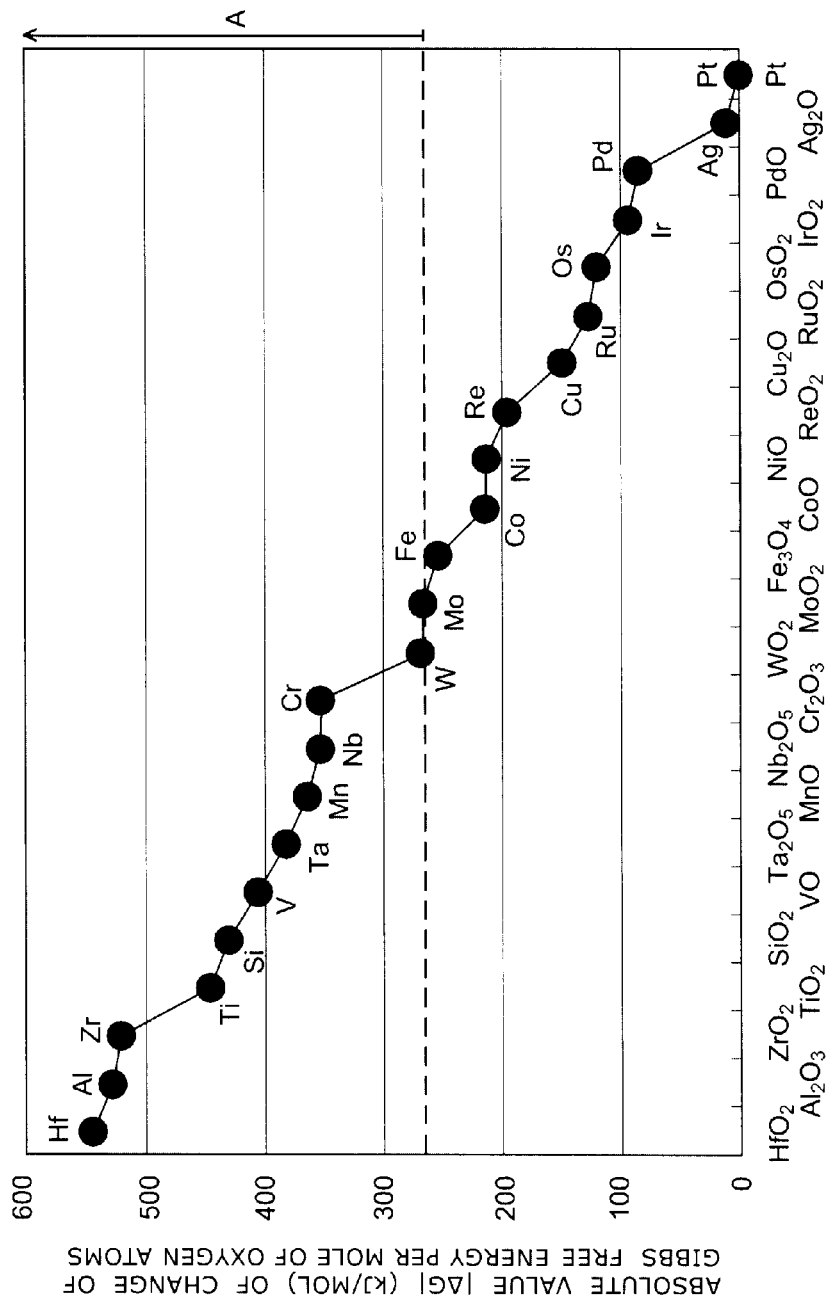
FIG. 3 is a graph comparing formation energies of oxides, in which the horizontal axis illustrates various oxides, and the vertical axis illustrates the absolute value of the change of the Gibbs free energy |ΔG| when the oxides are formed from metals.

FIG. 3 is a graph comparing formation energies of oxides, in which the horizontal axis illustrates various oxides, and the vertical axis illustrates the absolute value of the change of the Gibbs free energy $|\Delta G|$ when the oxides are formed from the metals.

The values of $|\Delta G|$ illustrated on the vertical axis of FIG. 3 are values per mole of oxygen atoms when the temperature is 300 K.

As described above, as the value of $|\Delta G|$ increases, oxides form easily and reduction into metals does not occur easily. In other words, the oxides are stable. As illustrated in FIG. 3, it is favorable for the insulating layer 26 to be formed of an oxide plotted in the range in which $|\Delta G|$ is greater than $|\Delta G_{W \to WO_2}|$, i.e., range A of FIG. 3 in the case where the needle-like metal oxide 27 is formed of tungsten oxide ($WO_2$).

The existence or absence of the retention degradation can be predicted by comparing $|\Delta G|$ per mole of oxygen atoms between the right side and the left side of the reaction equation. Manganese (Mn) and nickel (Ni) will now be illustrated as an example. The oxidation-reduction reaction between manganese and nickel can be represented by the following reaction equation.

$$\tfrac{1}{4}Mn_3O_4+Ni \Leftrightarrow \tfrac{3}{4}Mn+NiO$$

Here, when the temperature is 300 K, $|\Delta G_{Mn \to Mn_3O_4}|$ of the left side is $|\Delta G_{Mn \to Mn_3O_4}|=\tfrac{1}{4} \times 1435=359$ (kJ/mol).

On the other hand, when the temperature is 300 K, $|\Delta G_{Ni \to NiO}|$ of the right side is $|\Delta G_{Ni \to NiO}|=251$ (kJ/mol).

Therefore, the left side is more stable than the right side; the reaction progresses easily from the right side to the left side; and the reaction does not progress easily from the left side to the right side. Accordingly, for the relationship between manganese oxide and nickel oxide, the retention degradation does not occur easily in the case where the needle-like metal oxide 27 is formed of nickel oxide and the insulating layer 26 is formed of manganese oxide.

As illustrated in FIG. 3, other than tungsten oxide ($WO_2$), materials favorable as the needle-like metal oxide 27, i.e., materials having small absolute values of the Gibbs free energy $|\Delta G|$, include molybdenum oxide ($MoO_2$), iron oxide ($Fe_3O_4$), cobalt oxide (CoO), nickel oxide (NiO), etc. In other words, it is favorable for the needle-like metal oxide 27 to be formed of oxides of these metals. On the other hand, other than silicon oxide ($SiO_2$), materials favorable as the insulating layer 26, i.e., materials having large absolute values of the Gibbs free energy $|\Delta G|$, include hafnia ($HfO_2$), alumina ($Al_2O_3$), zirconia ($ZrO_2$), titania ($TiO_2$), vanadium oxide (VO), tantalum oxide ($Ta_2O_5$), etc. The insulating layer 26 may be formed of an insulating material other than an oxide.

Although an example is illustrated in the embodiment in which binary data is stored in each of the memory cells, this is not limited thereto. Resistance values of three or more levels may be realized in each of the memory cells by providing two or more needles of needle-like metal oxide 27 piercing the insulating layer 26 in the vertical direction; and data of three or more values may be stored.

A second embodiment will now be described.

The embodiment is an embodiment of a method for manufacturing the nonvolatile memory device according to the first embodiment described above.

FIG. 4A to FIG. 7B are cross-sectional views of processes, illustrating the method for manufacturing the nonvolatile memory device according to the embodiment; and drawings A and B of each of these drawings illustrate mutually orthogonal cross sections.

First, as illustrated in FIG. 1, the silicon substrate 11 is prepared. The silicon substrate 11 is, for example, a portion of a silicon wafer. Then, a drive circuit configured to drive the memory cell unit 13 is formed in the upper surface of the silicon substrate 11. Then, the inter-layer insulating film 12 is formed on the silicon substrate 11.

Figure 4A:
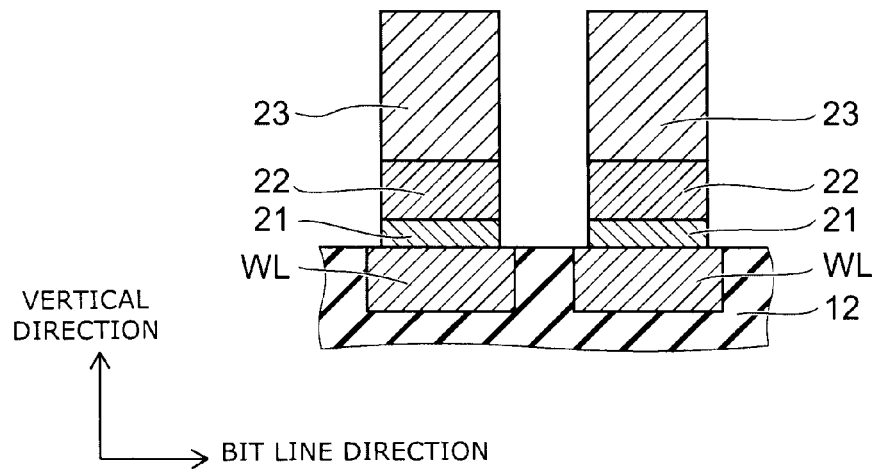
FIGS. 4A and 4B are cross-sectional views of processes, illustrating a method for manufacturing a nonvolatile memory device according to a second embodiment.
Figure 4B:
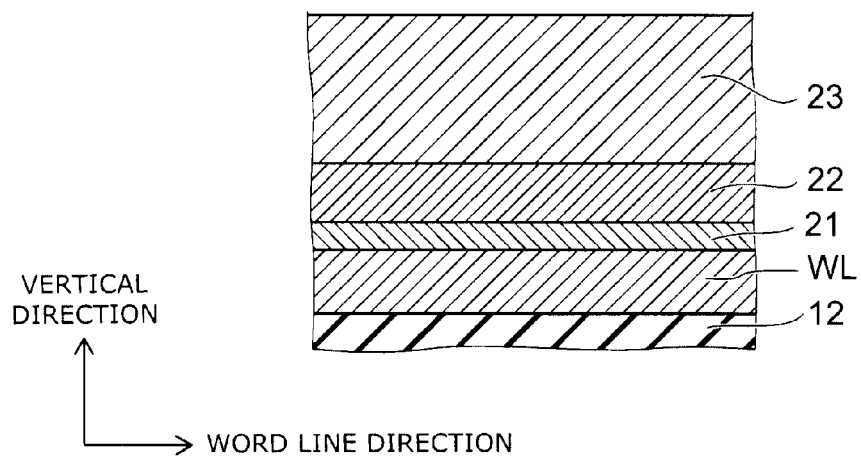

Continuing as illustrated in FIGS. 4A and 4B, the multiple word lines WL extending in the word line direction are formed in the upper layer portion of the inter-layer insulating film 12. The word line interconnect layer 14 is formed of these word lines WL. Then, the barrier metal layer 21 is formed on the word line interconnect layer 14 by, for example, depositing titanium and titanium nitride. Then, the selection element layer 22 is formed on the barrier metal layer 21 by, for example, depositing amorphous silicon into which an impurity is introduced. Then, the lower electrode layer 23 is formed on the selection element layer 22 by depositing tungsten.

Then, a resist pattern (not illustrated) is formed on the lower electrode layer 23; and dry etching such as, for example, RIE (reactive ion etching) is performed using the resist pattern as a mask. Thereby, the lower electrode layer 23, the selection element layer 22, and the barrier metal layer 21 are divided along the bit line direction and patterned into line configurations extending in the word line direction by being selectively removed. At this time, the barrier metal layer 21, the selection element layer 22, and the lower electrode layer 23 patterned into the line configuration are positioned in the region directly above the word line WL.

Figure 5A:
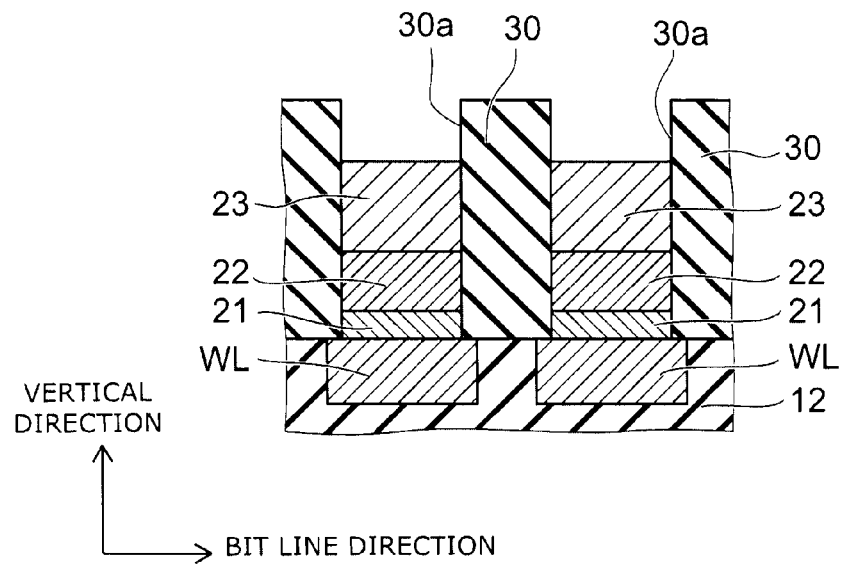
FIGS. 5A and 5B are cross-sectional views of processes, illustrating the method for manufacturing the nonvolatile memory device according to the second embodiment.
Figure 5B:
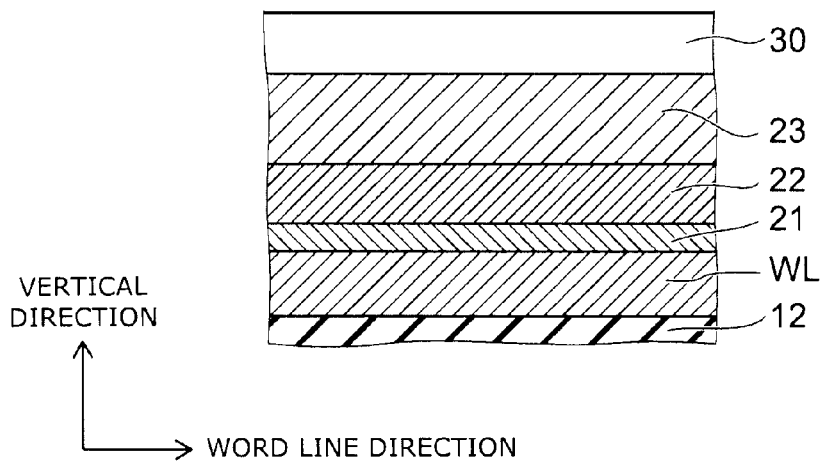

Continuing as illustrated in FIGS. 5A and 5B, the inter-layer insulating film 30 is formed around the barrier metal layer 21, the selection element layer 22, and the lower electrode layer 23 patterned into the line configuration by depositing, for example, silicon oxide. Then, the lower electrode layer 23 is exposed at the upper surface of the inter-layer insulating film 30 by planarizing the upper surface of the inter-layer insulating film 30 by performing, for example, CMP (Chemical Mechanical Polishing). Then, etch-back of the upper portion of the lower electrode layer 23 is performed. At this time, the lower portion of the lower electrode layer 23 remains. Thereby, the upper surface of the lower electrode layer 23 is lower than the upper surface of the inter-layer insulating film 30 to make a trench 30a in the upper surface of the inter-layer insulating film 30.

Figure 6A:
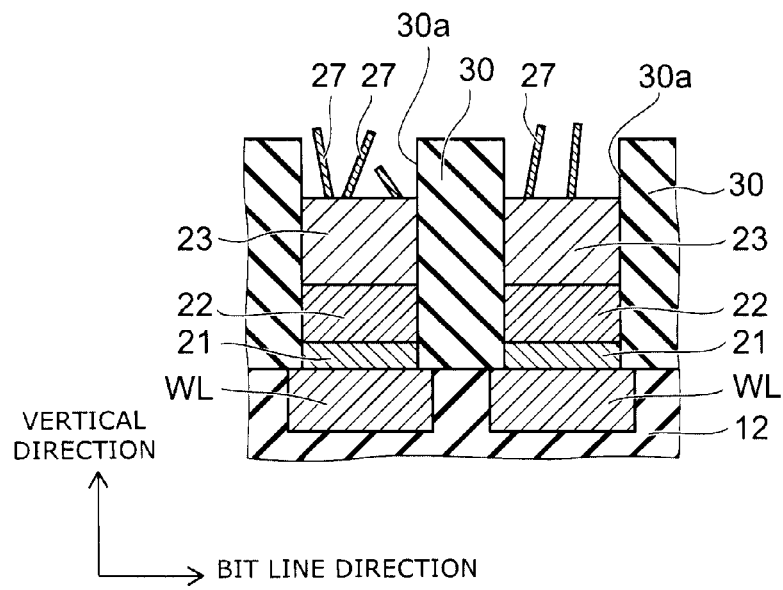
FIGS. 6A and 6B are cross-sectional views of processes, illustrating the method for manufacturing the nonvolatile memory device according to the second embodiment.
Figure 6B:
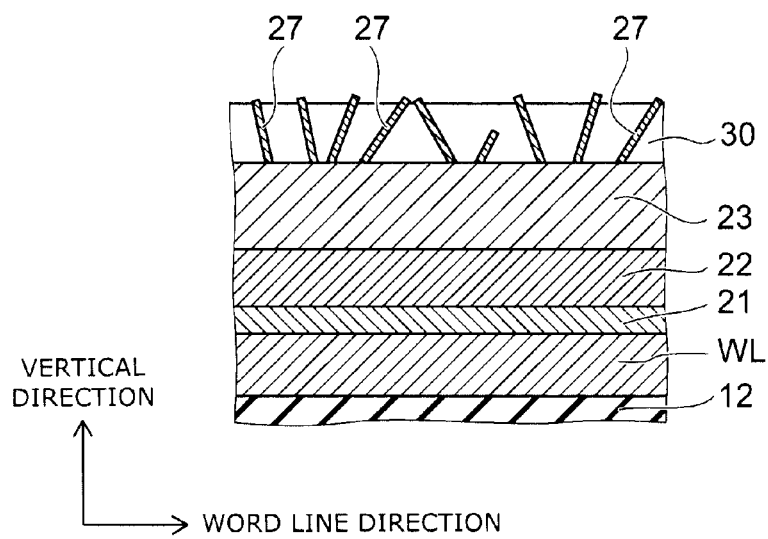

Then, as illustrated in FIGS. 6A and 6B, heating is performed in an atmosphere including oxygen. The heating is performed at conditions such that a whisker grows from the lower electrode layer 23 inside the trench 30a. The heating is implemented, for example, at a pressure of 1 atmosphere, with an oxygen concentration of about several ppm to several tens of ppm, e.g., 60 ppm, at a temperature of not less than 600° C., e.g., 800 to 900° C., for about several tens of seconds, e.g., 30 seconds. Thereby, a whisker grows by the tungsten oxide sublimating from the upper surface of the lower electrode layer 23 made of tungsten, re-adhering to the upper surface of the lower electrode layer 23, and crystallizing. This whisker becomes the needle-like metal oxide 27.

At this time, the length, the diameter, and the formation density of the needle-like metal oxide 27 can be controlled by adjusting the conditions of the heating described above. The direction in which the needle-like metal oxide 27 extends depends on the crystal orientation of the lower electrode layer 23. Thereby, about several to several tens of needles of the needle-like metal oxide 27, for example, are formed in the region where each of the pillars 16 (referring to FIGS. 2A and 2B) is to be formed; and at least one of these needles of the needle-like metal oxide 27 passes through the trench 30a in the vertical direction to protrude from the upper surface of the inter-layer insulating film 30.

Figure 7A:
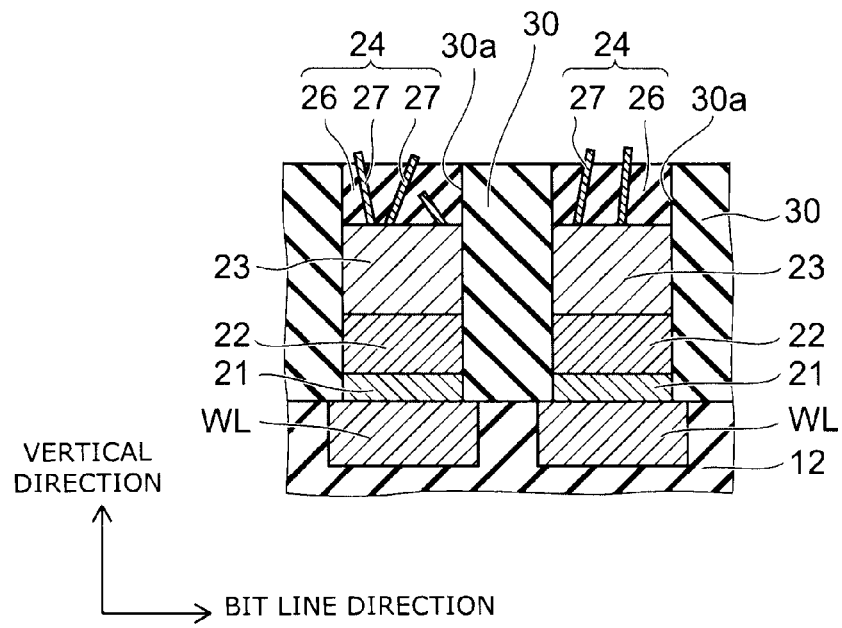
FIGS. 7A and 7B are cross-sectional views of processes, illustrating the method for manufacturing the nonvolatile memory device according to the second embodiment.
Figure 7B:
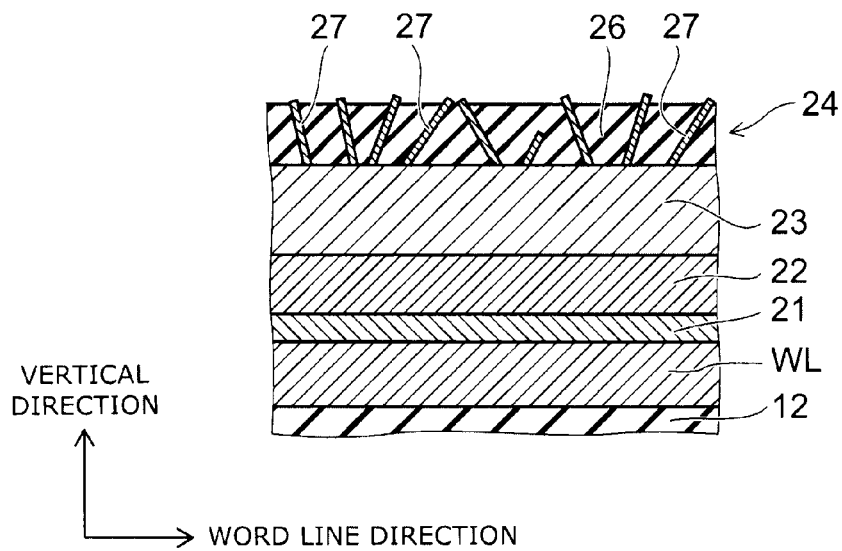

Then, as illustrated in FIGS. 7A and 7B, an insulating material, e.g., silicon oxide, is filled into the trench 30a using a liquid source material. For example, an organic material such as polysilazane is coated using spin coating and dried; and subsequently, the upper surface of the inter-layer insulating film 30 is exposed by planarizing the upper surface by performing CMP. Thereby, the insulating layer 26 is formed to bury the needle-like metal oxide 27 inside the trench 30a. The resistance change layer 24 is formed of the insulating layer 26 and the needle-like metal oxide 27.

Continuing as illustrated in FIGS. 2A and 2B, a stacked film is formed on the upper surfaces of the inter-layer insulating film 30 and the resistance change layer 24 by depositing the titanium nitride and the tungsten in this order. Then, a resist pattern (not illustrated) is formed on the stacked film; and the stacked film is patterned into a stripe configuration extending in a direction orthogonal to the word line WL by etching using the resist pattern as a mask. Thereby, the multiple bit lines BL and the multiple upper electrode layers 25 are formed extending in the bit line direction. At this time, the upper end of the needle-like metal oxide 27 piercing the insulating layer 26 contacts the lower surface of the upper electrode layer 25. The bit line interconnect layer 15 is formed of the multiple bit lines BL. Continuing, the resistance change layer 24, the lower electrode layer 23, the selection element layer 22, and the inter-layer insulating film 30 positioned in the layers lower than the upper electrode layer 25 are divided along the word line direction by etching using the resist pattern described above or the stacked film after the patterning as a mask. Thereby, the pillar 16 extending in the vertical direction is patterned by dividing the selection element layer 22, the lower electrode layer 23, and the resistance change layer 24 along both the bit line direction and the word line direction. Then, the inter-layer insulating film 30 is formed between the pillars 16 and between the bit lines BL.

Then, using methods similar to the methods described above, the barrier metal layer 21, the selection element layer 22, and the lower electrode layer 23 are stacked on the bit line BL and patterned into a line configuration extending in the bit line direction. Then, the resistance change layer 24 is formed by making the trench 30a by performing etch-back of the upper portion of the lower electrode layer 23, growing the needle-like metal oxide 27 by heating in an oxygen atmosphere, and filling the insulating layer 26 into the trench 30a. Thereafter, the formation of the word line interconnect layer 14, the stacking of the barrier metal layer 21, the selection element layer 22, the lower electrode layer 23, the resistance change layer 24, and the upper electrode layer 25, the formation of the bit line interconnect layer 15, and the stacking of the barrier metal layer 21, the selection element layer 22, the lower electrode layer 23, the resistance change layer 24, and the upper electrode layer 25 are repeated using similar methods. Thereby, the nonvolatile memory device 1 according to the first embodiment described above is manufactured.

According to the embodiment, the nonvolatile memory device according to the first embodiment described above can be manufactured without performing the forming operation to form the filament inside the resistance change layer 24. Thereby, a low-cost nonvolatile memory device with high operational reliability can be realized.

A third embodiment will now be described.

The embodiment also is an embodiment of a method for manufacturing the nonvolatile memory device according to the first embodiment described above.

FIG. 8A to FIG. 11B are cross-sectional views of processes, illustrating the method for manufacturing the nonvolatile memory device according to the embodiment; and drawings A and B of each of these drawings illustrate mutually orthogonal cross sections.

Figure 8A:
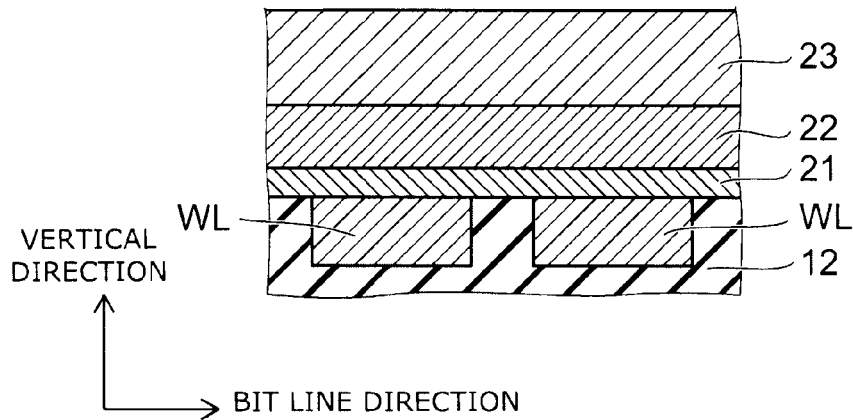
FIGS. 8A and 8B are cross-sectional views of processes, illustrating a method for manufacturing a nonvolatile memory device according to a third embodiment.
Figure 8B:
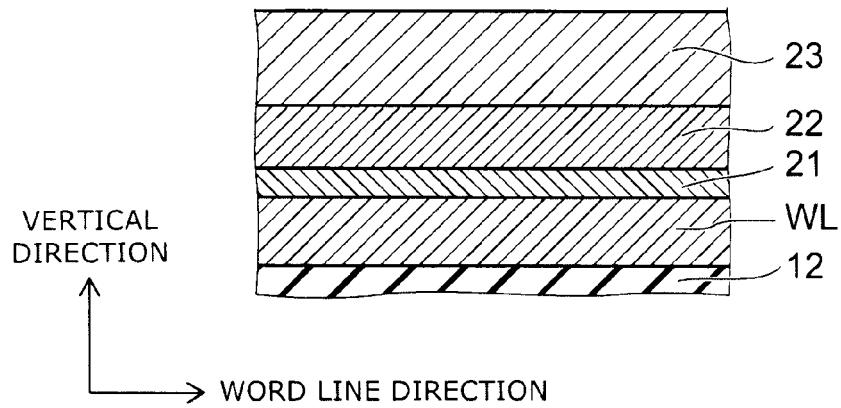

First, as illustrated in FIG. 1 and FIGS. 8A and 8B, using methods similar to those of the second embodiment described above, a drive circuit is formed in the upper surface of the silicon substrate 11; the inter-layer insulating film 12 is formed thereon; and the word line WL is formed in the upper layer portion of the inter-layer insulating film 12. Then, the barrier metal layer 21, the selection element layer 22, and the lower electrode layer 23 are formed in this order. However, the thickness of the lower electrode layer 23 is the thickness of that of the second embodiment after the etch-back described above (referring to FIGS. 5A and 5B).

Figure 9A:
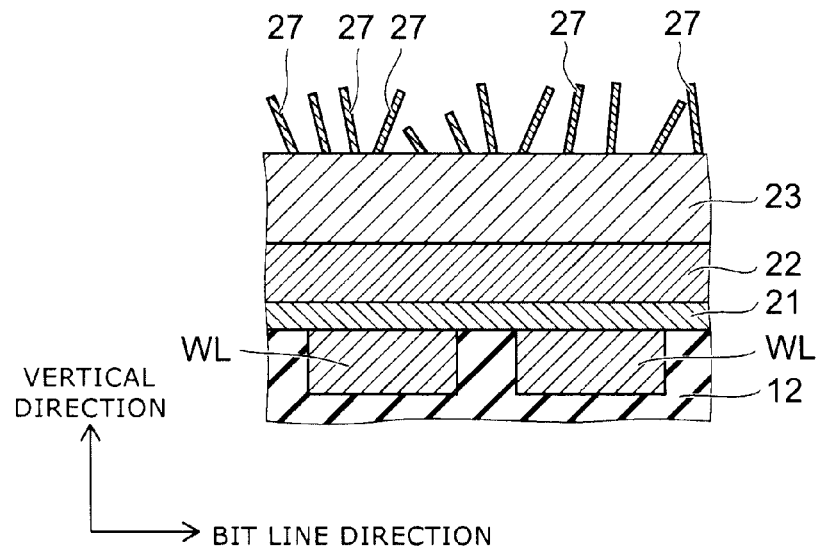
FIGS. 9A and 9B are cross-sectional views of processes, illustrating the method for manufacturing the nonvolatile memory device according to the third embodiment.
Figure 9B:
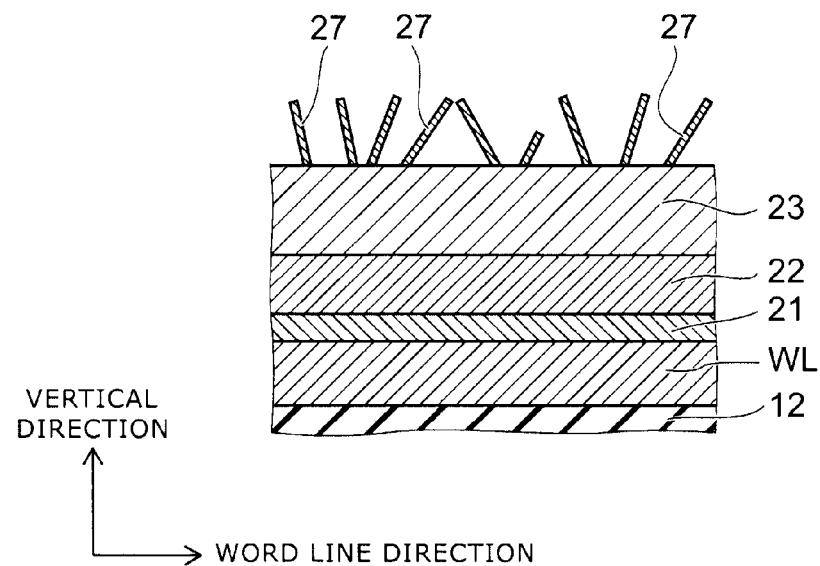

The subsequent methods are different from those of the second embodiment described above. Namely, as illustrated in FIGS. 9A and 9B, the whisker made of tungsten oxide is grown on the lower electrode layer 23 made of tungsten by heating in an atmosphere including oxygen without patterning the lower electrode layer 23. The conditions of the heating are similar to those of the second embodiment described above. Thereby, the needle-like metal oxide 27 is formed.

Figure 10A:
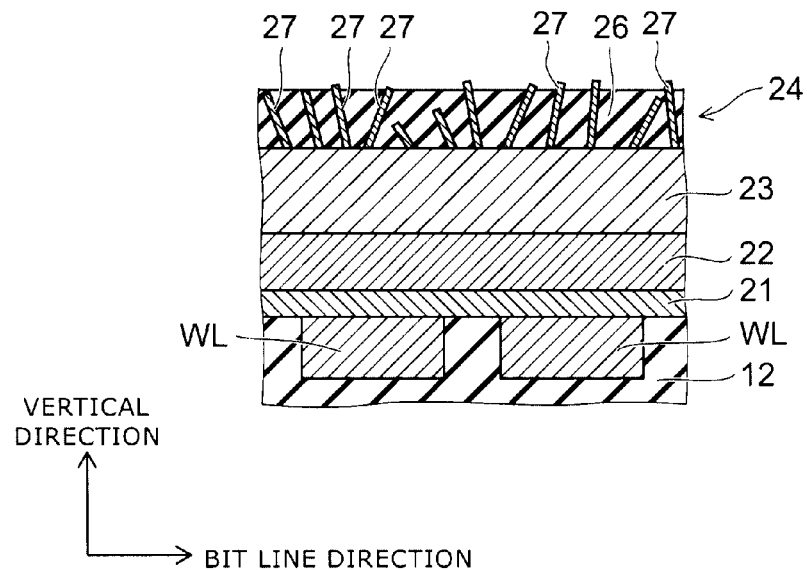
FIGS. 10A and 10B are cross-sectional views of processes, illustrating the method for manufacturing the nonvolatile memory device according to the third embodiment.
Figure 10B:
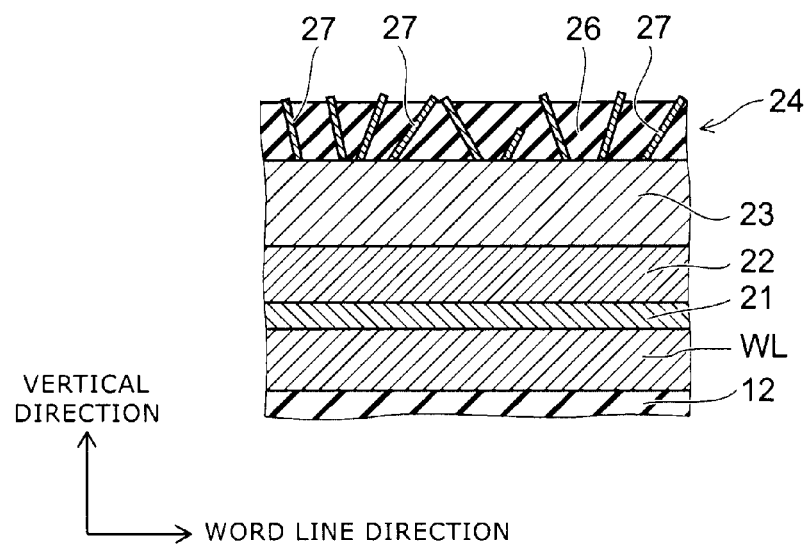

Then, as illustrated in FIGS. 10A and 10B, an insulating material, e.g., silicon oxide, is deposited on the lower electrode layer 23 using a liquid source material. Thereby, the insulating layer 26 is formed to bury the needle-like metal oxide 27. At this time, at least one needle of the needle-like metal oxide 27 pierces the insulating layer 26 in each region where the pillar 16 is to be formed (referring to FIGS. 2A and 2B). The resistance change layer 24 is formed of the insulating layer 26 and the needle-like metal oxide 27.

Figure 11A:
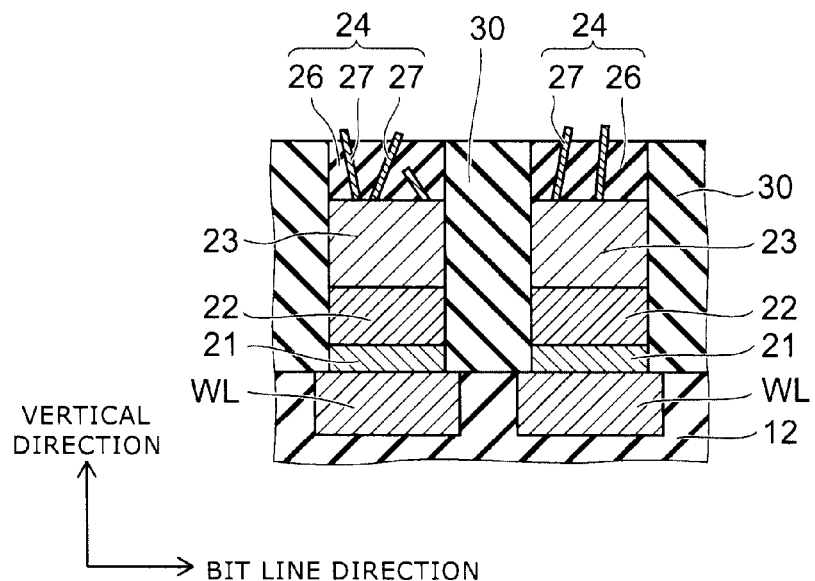
FIGS. 11A and 11B are cross-sectional views of processes, illustrating the method for manufacturing the nonvolatile memory device according to the third embodiment.
Figure 11B:
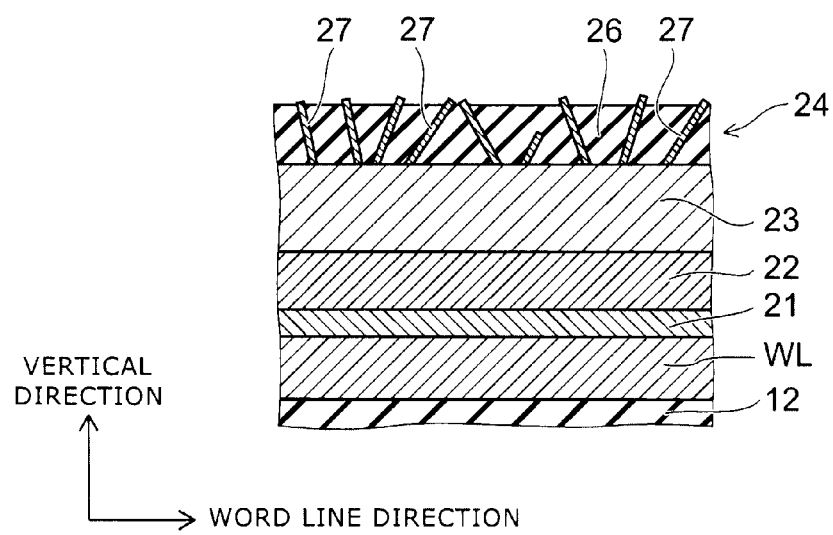

Continuing as illustrated in FIGS. 11A and 11B, a resist pattern (not illustrated) is formed on the resistance change layer 24; and dry etching such as, for example, RIE is performed using the resist pattern as a mask. Thereby, the resistance change layer 24, the lower electrode layer 23, the selection element layer 22, and the barrier metal layer 21 are patterned into a line configuration extending in the word line direction by being selectively removed. Then, the inter-layer insulating film 30 is formed to bury the barrier metal layer 21, the selection element layer 22, the lower electrode layer 23, and the resistance change layer 24 patterned into the line configuration by depositing, for example, silicon oxide. Then, the resistance change layer 24 is exposed at the upper surface of the inter-layer insulating film 30 by planarizing the upper surface of the inter-layer insulating film 30 by performing CMP.

The subsequent methods are similar to those of the second embodiment described above. In other words, the multiple bit lines BL and the multiple upper electrode layers 25 are formed extending in the bit line direction by depositing titanium nitride and tungsten in this order on the upper surfaces of the inter-layer insulating film 30 and the resistance change layer 24 and by patterning. Continuing, the resistance change layer 24, the lower electrode layer 23, and the selection element layer 22 are divided along the bit line direction by being patterned with the inter-layer insulating film 30. Thereby, the pillar 16 is formed by dividing the selection element layer 22, the lower electrode layer 23, and the resistance change layer 24 along both the word line direction and the bit line direction. Then, the pillar 16 and the bit line BL are buried in the inter-layer insulating film 30. Then, the barrier metal layer 21, the selection element layer 22, the lower electrode layer 23, and the resistance change layer 24 are formed also on the bit line BL. By repeating the processes recited above, the nonvolatile memory device 1 according to the first embodiment described above is manufactured. Otherwise, the methods for manufacturing and the operational effects of the embodiment are similar to those of the second embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

According to the embodiments described above, a low-cost nonvolatile memory device with high operational reliability and a method for manufacturing the same can be realized.

What is claimed is:

1. A nonvolatile memory device, comprising:
   a first interconnect;
   an insulating layer provided on the first interconnect;
   a needle-like metal oxide piercing the insulating layer to extend throughout an entire thickness of the insulating layer in a vertical direction; and
   a second interconnect provided on the insulating layer;
   wherein
   the insulating layer is formed of an oxide, and
   an absolute value of a change of a Gibbs free energy per mole of oxygen atoms when a metal included in the needle-like metal oxide changes into a metal oxide of the needle-like metal oxide is less than an absolute value of a change of a Gibbs free energy per mole of oxygen atoms when a metal or a semimetal included in the insulating layer changes into the oxide of the insulating layer; and
   further comprising a lower electrode layer provided between the first interconnect and the insulating layer to contact the insulating layer,
   the needle-like metal oxide being formed of an oxide of the same type of metal as a metal included in the lower electrode layer.

2. The device according to claim 1, wherein the oxide is silicon oxide.

3. The device according to claim 1, wherein an oxygen concentration of an upper end portion of the needle-like metal oxide increases when a potential higher than a potential of the first interconnect is applied to the second interconnect.

4. The device according to claim 1, wherein an oxygen concentration of a lower end portion of the needle-like metal oxide does not increase when a potential higher than a potential of the second interconnect is applied to the first interconnect.

5. The device according to claim 1, wherein the needle-like metal oxide contains tungsten or molybdenum.

6. The device according to claim 1, wherein the oxide is manganese oxide, the metal included in the lower electrode layer is nickel, and the needle-like metal oxide is formed of nickel oxide.

7. The device according to claim 1, further comprising
   an upper electrode layer provided between the second interconnect and the insulating layer to contact the insulating layer,
   the needle-like metal oxide being in contact with the upper electrode layer.

8. The device according to claim 7, wherein the needle-like metal oxide is in contact with the lower electrode layer.

9. The device according to claim 1, wherein the needle-like metal oxide is a whisker grown from the lower electrode layer.

10. The device according to claim 9, wherein a lower end portion of the needle-like metal oxide is integrally bonded to the lower electrode layer.

11. The device according to claim 1, wherein:
    the second interconnect and the first interconnect extend in mutually intersecting directions;
    a first interconnect layer including a plurality of the first interconnects is stacked alternately with a second interconnect layer including a plurality of the second interconnects; and
    the insulating layer is provided between the first interconnects and the second interconnects.

12. The device according to claim 1, wherein the needle-like metal oxide is a semiconductor.

13. A nonvolatile memory device, comprising:
a first interconnect;
an insulating layer provided on the first interconnect;
a needle-like metal oxide piercing the insulating layer to extend throughout an entire thickness of the insulating layer in a vertical direction;
a second interconnect provided on the insulating layer; and
a lower electrode layer provided between the first interconnect and the insulating layer to contact the insulating layer,
the needle-like metal oxide being formed of an oxide of the same type of metal as a metal included in the lower electrode layer.

14. The device according to claim 13, wherein the needle-like metal oxide contains tungsten or molybdenum.

15. The device according to claim 13, wherein the oxide is manganese oxide, the metal included in the lower electrode layer is nickel, and the needle-like metal oxide is formed of nickel oxide.

16. The device according to claim 13, further comprising an upper electrode layer provided between the second interconnect and the insulating layer to contact the insulating layer,
the needle-like metal oxide being in contact with the upper electrode layer.

17. The device according to claim 16, wherein the needle-like metal oxide is in contact with the lower electrode layer.

18. The device according to claim 13, wherein the needle-like metal oxide is a whisker grown from the lower electrode layer.

19. The device according to claim 18, wherein a lower end portion of the needle-like metal oxide is integrally bonded to the lower electrode layer.

20. The device according to claim 13, wherein:
the second interconnect and the first interconnect extend in mutually intersecting directions;
a first interconnect layer including a plurality of the first interconnects is stacked alternately with a second interconnect layer including a plurality of the second interconnects; and
the insulating layer is provided between the first interconnects and the second interconnects.

21. The device according to claim 13, wherein the needle-like metal oxide is a semiconductor.

22. A nonvolatile memory device, comprising:
a first interconnect;
an insulating layer provided on the first interconnect;
a needle-like metal oxide piercing the insulating layer to extend throughout an entire thickness of the insulating layer in a vertical direction; and
a second interconnect provided on the insulating layer; wherein:
the second interconnect and the first interconnect extend in mutually intersecting directions;
a first interconnect layer including a plurality of the first interconnects is stacked alternately with a second interconnect layer including a plurality of the second interconnects; and
the insulating layer is provided between the first interconnects and the second interconnects.

23. The device according to claim 22, wherein the needle-like metal oxide contains tungsten or molybdenum.

24. The device according to claim 22, wherein the needle-like metal oxide is a semiconductor.

* * * * *